(12) United States Patent
Liao et al.

(10) Patent No.: US 11,538,853 B2
(45) Date of Patent: Dec. 27, 2022

(54) MICRO LED TRANSPARENT DISPLAY

(71) Applicant: PlayNitride Display Co., Ltd., Miaoli County (TW)

(72) Inventors: Kuan-Yung Liao, Miaoli County (TW); Yun-Li Li, Miaoli County (TW)

(73) Assignee: PlayNitride Display Co., Ltd., Miaoli County (TW)

( * ) Notice: Subject to any disclaimer, the term of this patent is extended or adjusted under 35 U.S.C. 154(b) by 177 days.

(21) Appl. No.: 17/135,949

(22) Filed: Dec. 28, 2020

(65) Prior Publication Data
US 2022/0165785 A1 May 26, 2022

(30) Foreign Application Priority Data
Nov. 20, 2020 (TW) .................................. 109140887

(51) Int. Cl.
*H01L 27/15* (2006.01)
*H01L 33/42* (2010.01)
*H01L 33/62* (2010.01)
*G02F 1/1335* (2006.01)

(52) U.S. Cl.
CPC ...... *H01L 27/156* (2013.01); *G02F 1/133536* (2013.01); *H01L 33/42* (2013.01); *H01L 33/62* (2013.01)

(58) Field of Classification Search
CPC ....... H01L 27/156; H01L 33/42; H01L 33/62; H01L 33/60; H01L 25/0753; G02F 1/133536
See application file for complete search history.

(56) References Cited

U.S. PATENT DOCUMENTS

| 11,392,007 | B2* | 7/2022 | Li | G09G 3/344 |
| 2015/0340346 | A1* | 11/2015 | Chu | H01L 33/50 257/89 |
| 2020/0058625 | A1* | 2/2020 | Chen | H01L 33/46 |
| 2020/0312220 | A1* | 10/2020 | Hussell | F21V 23/06 |
| 2020/0312231 | A1* | 10/2020 | Hussell | G09G 3/2085 |
| 2020/0393724 | A1* | 12/2020 | Li | G09G 3/32 |
| 2021/0278727 | A1* | 9/2021 | Zhou | G02F 1/133606 |

(Continued)

FOREIGN PATENT DOCUMENTS

| CN | 1834754 A | 9/2006 |
| CN | 103345884 A | 10/2013 |

(Continued)

*Primary Examiner* — Victor A Mandala
(74) *Attorney, Agent, or Firm* — CKC & Partners Co., LLC

(57) ABSTRACT

A micro LED transparent display has a first display surface and a second display surface, which are opposite to each other. The micro LED transparent display includes a substrate, pixels and at least one grating layer. The first display surface and the second display surface are located on two opposite sides of the substrate, respectively. The pixels are arranged in arrays on the substrate, each of the pixels includes micro LEDs, and the micro LEDs are electrically connected to the substrate. The grating layer is disposed on the substrate, and the micro LEDs are located between the grating layer and the substrate. Lights generated from the micro LEDs of the pixels can be controlled by the grating layer, and the lights partially penetrate through the first display surface and are partially reflected and penetrate through the second display surface.

14 Claims, 6 Drawing Sheets

(56) References Cited

U.S. PATENT DOCUMENTS

2021/0327340 A1* 10/2021 Fan ..................... H01L 27/156
2021/0389615 A1* 12/2021 Rodrigues ......... G02F 1/133504
2021/0399042 A1* 12/2021 Li ....................... H01L 31/125

FOREIGN PATENT DOCUMENTS

| CN | 106707583 A | 5/2017 |
|---|---|---|
| CN | 107167943 A | 9/2017 |
| CN | 206757205 U | 12/2017 |
| CN | 107680989 A | 2/2018 |
| CN | 108873418 A | 11/2018 |
| EP | 3407396 A1 | 11/2018 |
| WO | 2017188715 A2 | 11/2017 |
| WO | 2020143266 A1 | 7/2020 |

* cited by examiner

MICRO LED TRANSPARENT DISPLAY

RELATED APPLICATIONS

This application claims priority to Taiwan Application Serial Number 109140887, filed Nov. 20, 2020, which is herein incorporated by reference.

BACKGROUND

Technical Field

The present disclosure relates to a transparent display. More particularly, the present disclosure relates to a micro LED transparent display.

Description of Related Art

According to the developing trend of the displays on the market, not only are single-side displays promoted, but dual-side displays are simultaneously developed. In general, a user can both observe the same images or the different images from two sides of the dual-side display via the dual-side displays.

However, the effect of the dual-side display of the dual-side display on the market is often obtained by disposing two display screens on two opposite sides of the dual-side display, respectively. Hence, the thickness of the dual-side display on the market may be too thick, and the transparency of the dual-side display on the market is worse.

SUMMARY

According to one aspect of the present disclosure, a micro LED transparent display has a first display surface and a second display surface, which are opposite to each other. The micro LED transparent display includes a substrate, a plurality of pixels and at least one grating layer. The first display surface and the second display surface are located on two opposite sides of the substrate, respectively. The pixels are arranged in arrays on the substrate, each of the pixels includes a plurality of micro LEDs, and the micro LEDs are electrically connected to the substrate. The grating layer is disposed on the substrate, and the micro LEDs are located between the grating layer and the substrate. Lights generated from the micro LEDs of the pixels can be controlled by the grating layer, and the lights partially penetrate through the first display surface and are partially reflected and penetrate through the second display surface.

DETAILED DESCRIPTION

Figure 1:
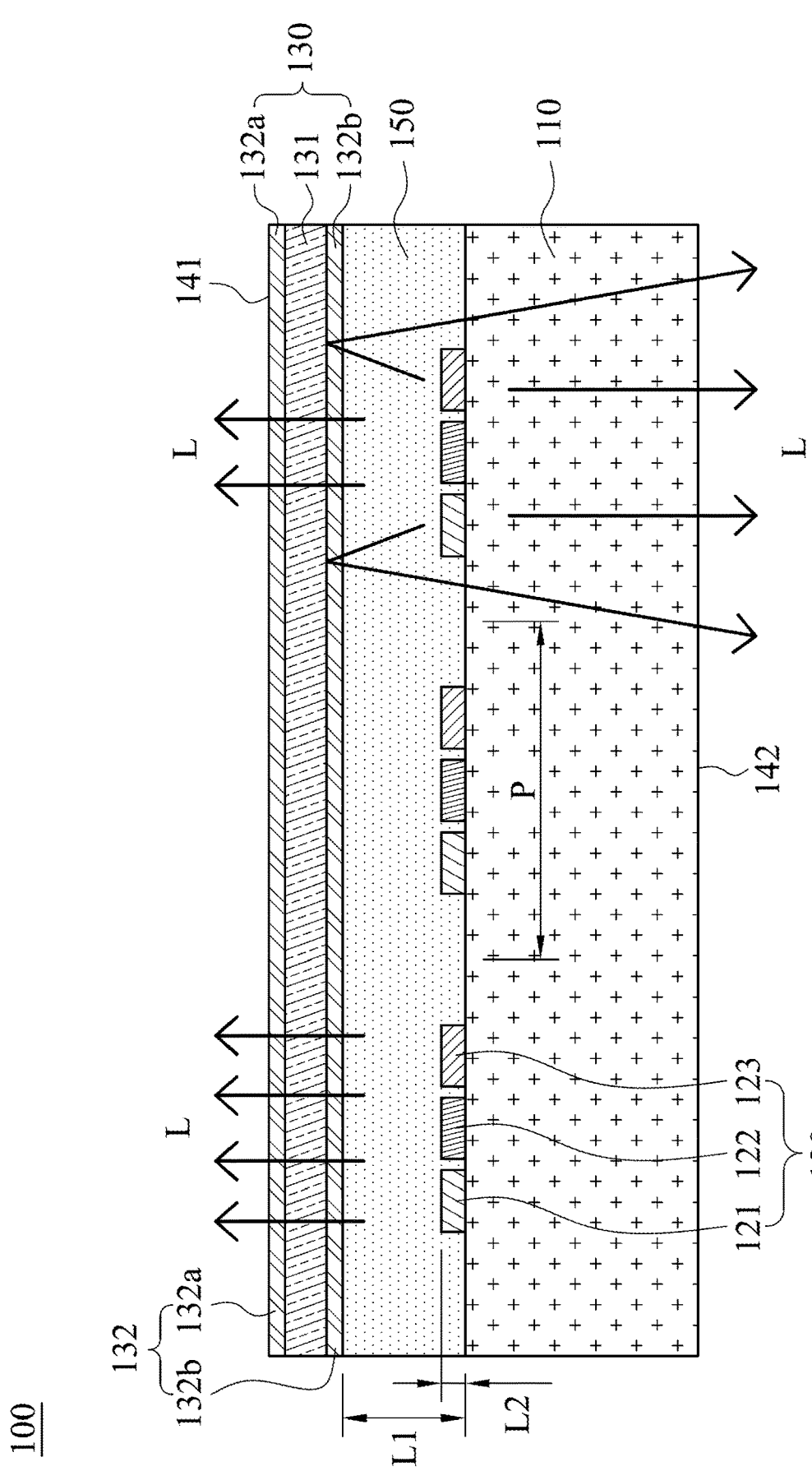
FIG. 1 is a schematic view of a micro LED transparent display according to an embodiment of the present disclosure.
Figure 2A:
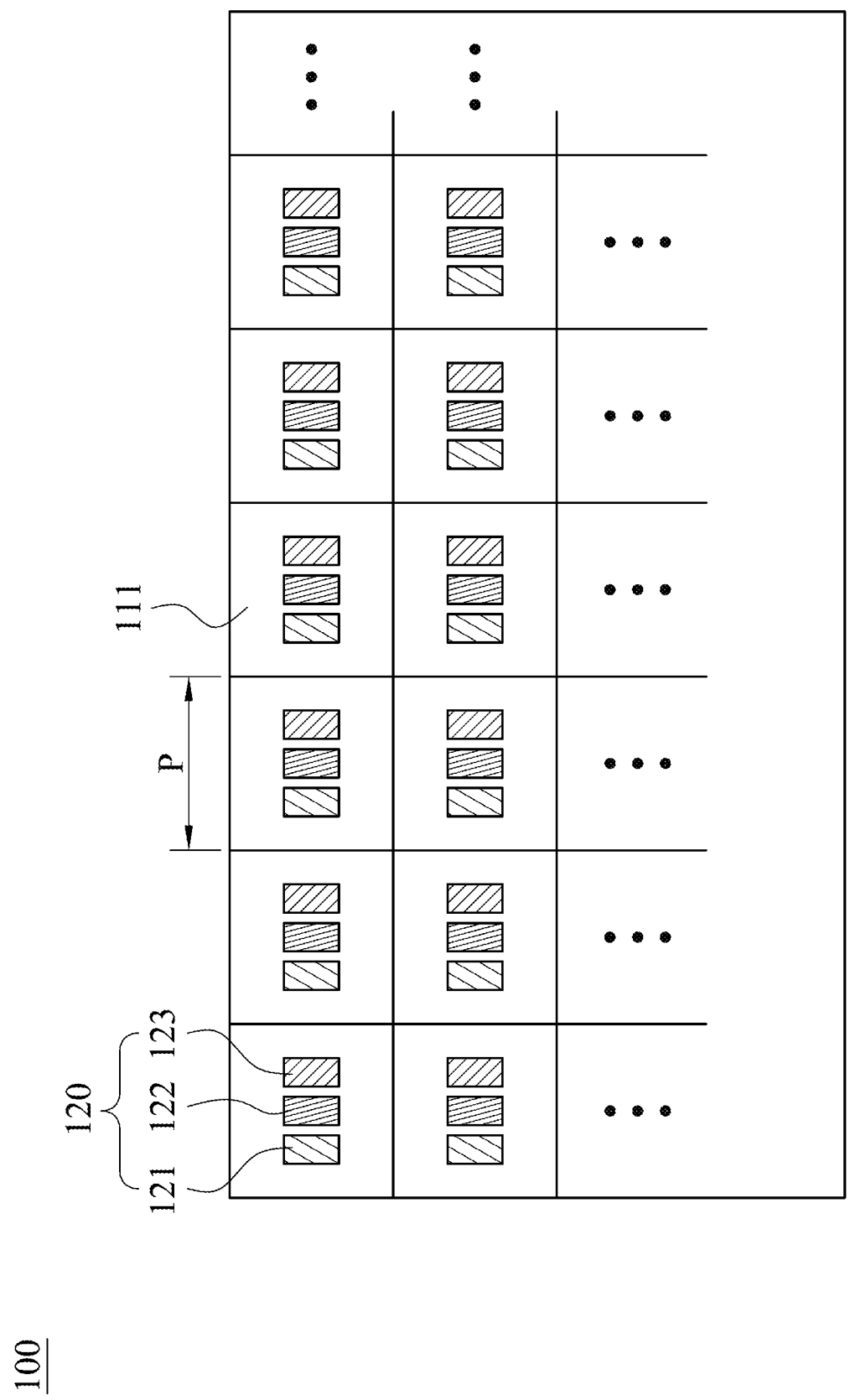
FIG. 2A is a disposing schematic view of the micro LED transparent display according to the embodiment in FIG. 1.

FIG. 1 is a schematic view of a micro LED transparent display 100 according to an embodiment of the present disclosure. FIG. 2A is a disposing schematic view of the micro LED transparent display 100 according to the embodiment in FIG. 1. In FIGS. 1 and 2A, the micro LED transparent display 100 has a first display surface 141 and a second display surface 142, which are opposite to each other. The micro LED transparent display 100 includes a substrate 110, a plurality of pixels 111, a flat layer 150 and at least one grating layer 130, wherein the first display surface 141 and the second display surface 142 are located on two opposite sides of the substrate 110, respectively.

Each of the pixels 111 is arranged in arrays on the substrate 110, at least one micro unit 120 is disposed on each of the pixels 111 as a self-luminous light source, and each of the pixels 111 includes a plurality of micro LEDs. In detail, each of the micro units 120 includes the micro LEDs, and the micro LEDs are electrically bonded to and connected to the substrate 110. According to the embodiment of FIG. 1, a number of the micro LEDs of each of the pixels 111 is three, and each of the micro units 120 includes the three micro LEDs 121, 122, 123. The micro LEDs 121, 122, 123 are separated into a red micro LED, a green micro LED and a blue micro LED, respectively, that is, the micro LEDs 121, 122, 123 emit a red light, a green light and a blue light, respectively, and the sequence thereof is not limited to the embodiment of FIG. 1. According to the embodiment of FIG. 1, each of the micro LEDs 121, 122, 123 is a thin film structure which a thickness thereof is thinner than 10 micrometers and a width thereof is smaller than 100 micrometers. Further, the thickness of each of the micro LEDs 121, 122, 123 can arrange from 5 micrometers to 10 micrometers, and the width of each of the micro LEDs 121, 122, 123 can be smaller than 30 micrometers. Moreover, the width of each of the micro LEDs 121, 122, 123 can be 10 micrometers to 30 micrometers, but the present disclosure is not limited thereto.

The grating layer 130 is disposed on the substrate 110, and the micro LEDs 121, 122, 123 are located between the grating layer 130 and the substrate 110, wherein the grating layer 130 can be a dyed liquid crystal layer, an electrophoresis layer, an electrochromic layer or a reflective polarizer film. According to the embodiment of FIG. 1, the grating layer 130 includes a dyed liquid crystal layer 131 and an electrode structure 132, wherein the dyed liquid crystal layer 131 is interposed between the electrode structure 132. The dyed liquid crystal layer 131 can be a nematic liquid crystal doped with a highly reflective dye, and the reflectance of the dyed liquid crystal layer 131 is controlled by an optical axis rotation of the nematic liquid crystal. In other words, the reflectance of the dyed liquid crystal layer 131 can be controlled by the electrode structure 132, but the present disclosure is not limited thereto. It should be mentioned that the grating layer can be composed of the electrophoresis layer and the electrode structure, and the reflectance can be changed by controlling the aggregation of the particles in the electrophoresis layer, that is, the reflectance of both of the dyed liquid crystal layer and the electrophoresis layer can be controlled by the electrode structure, but the present disclosure is not limited thereto.

In particular, lights L generated from the micro LEDs 121, 122, 123 of the pixels 111 can be controlled by the grating layer 130, and the lights L partially penetrate through the first display surface 141 and are partially reflected and penetrate through the second display surface 142. Therefore, the control of the light direction (that is, a display image can be shown from a front side, a back side or both of the front side and the back side) can be obtained, and the size or the thickness of the micro LED transparent display 100 can be reduced.

The electrode structure 132 includes an upper electrode pattern 132a and a lower electrode pattern 132b, and the dyed liquid crystal layer 131 is located between the upper electrode pattern 132a and the lower electrode pattern 132b. The rotation of the dyed liquid crystal in the dyed liquid crystal layer 131 is controlled by an electric field generated from the upper electrode pattern 132a and the lower electrode pattern 132b for adjusting a degree of a light penetration and a light reflection from the micro units 120. Therefore, a dual-side display or a single-side display of the micro LED transparent display 100 can be set up on demand, and a displaying luminance of the dual-side display of the micro LED transparent display 100 can be suitably adjusted. Further, the electrode structure 132 is a transparent conductive layer, and the upper electrode pattern 132a and the lower electrode pattern 132b can be an entire film, or the upper electrode pattern 132a and the lower electrode pattern 132b can be patterned according to the locations of the pixels 111.

The flat layer 150 is located between the substrate 110 and the grating layer 130 and covers the micro LEDs 121, 122, 123, and the flat layer 150 is an optical adhesive layer, wherein the optical adhesive layer has a high light transmittance (>80%), and the optical adhesive layer can be made of a polypropylene, but the present disclosure is not limited thereto. Furthermore, when a height of the flat layer 150 is L1, and a height of each of the micro LEDs 121, 122, 123 is L2, the following condition can be satisfied: $10 \geq L1/L2 > 5$. If $L1/L2 < 5$, a surface flatness of the flat layer 150 covering the micro units 120 is getting worse; if $L1/L2 > 10$, a yield rate of the subsequent processes and a light-emitting efficiency will be influenced. Therefore, the height L1 of the flat layer 150 should be larger than the height L2 of each of the micro LEDs 121, 122, 123, and a better ratio of L1/L2 arranges from 5 to 10.

Furthermore, when a spacing between every adjacent two of the pixels is P, the following condition is satisfied: $P \geq 100$ micrometers. Therefore, the penetration and the reflection of the lights L generated from the micro LEDs 121, 122, 123 can be avoided being influenced, and both of the transparency and the luminance of the micro LED transparent display 100 can be maintained so as to obtain the better display quality.

Figure 2B:
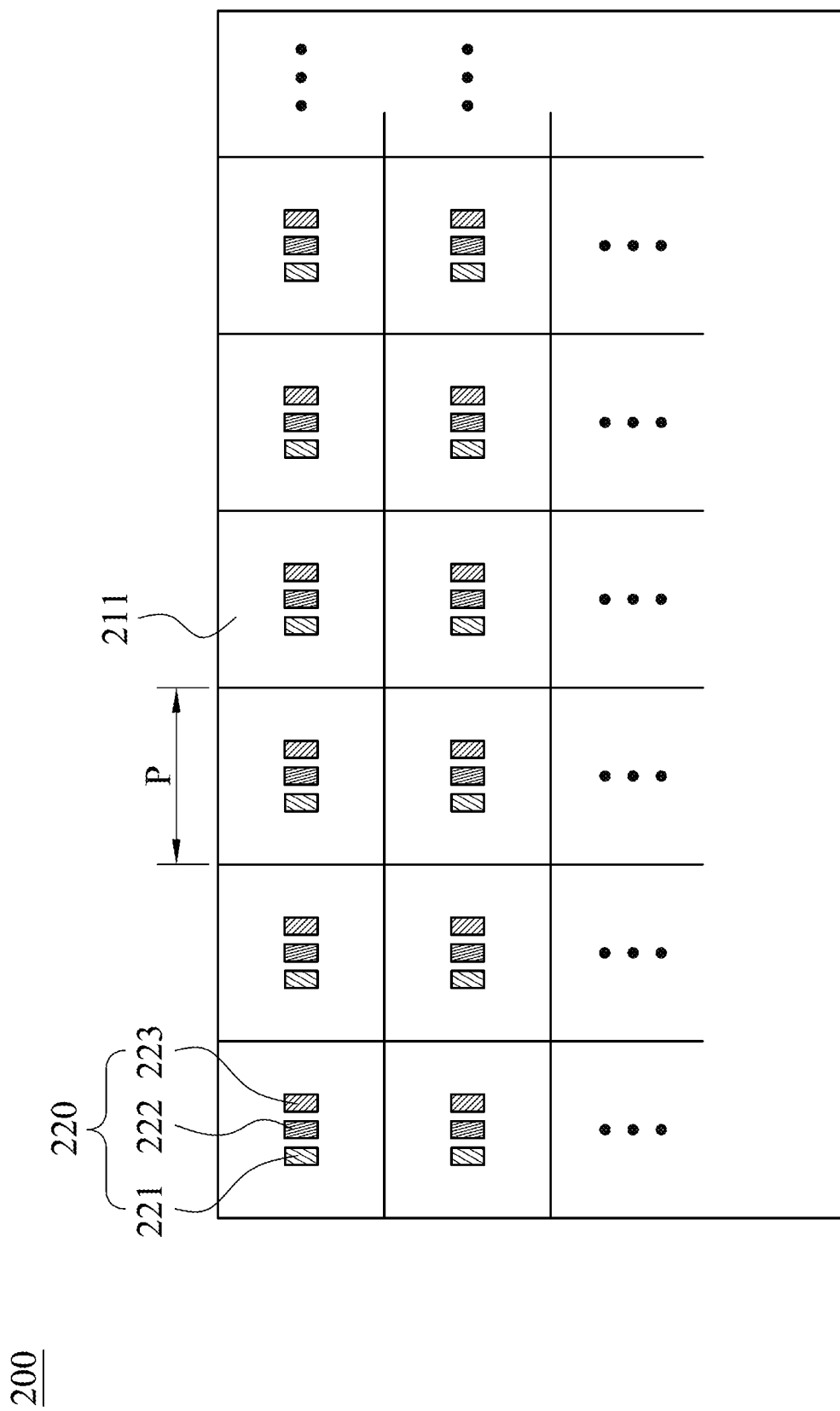
FIG. 2B is a disposing schematic view of the micro LED transparent display according to another embodiment of the present disclosure.

FIG. 2B is a disposing schematic view of the micro LED transparent display 200 according to another embodiment of the present disclosure. In FIGS. 2A and 2B, a micro LED transparent display 200 according to the embodiment of FIG. 2B is similar to the micro LED transparent display 100 according to the embodiment of FIG. 2A, an area ratio of micro units 220 of each of pixels 211 of the micro LED transparent display 200 according to the embodiment of FIG. 2B is different from an area ratio of the micro units 120 of each of the pixels 111 of the micro LED transparent display 100 according to the embodiment of FIG. 2A, and the area ratio of the micro units 220 of each of the pixels 211 of the micro LED transparent display 200 according to the embodiment of FIG. 2B is 10% to 25%. In detail, a total of a projecting area of three micro LEDs 221, 222, 223 of each of the pixels 211 on a substrate (not shown) is 10% to 25% of an area of the pixels 211. That is, the area of the pixels 211 is equal to a square of a spacing between every adjacent two of the pixels 211, and a range of the total projecting area of the three micro LEDs 221, 222, 223 on the substrate is $0.1 P^2$ to $0.25 P^2$. Therefore, the transparency of the micro LED transparent display 200 can be promoted, and the transparency of the micro LED transparent display 200 can be obtained at least 60% if the micro LED transparent display 200 cooperated with the disposition of $P \geq 100$ micrometers.

Further, all of other structures and dispositions according to the embodiment of FIG. 2B are the same as the structures and the dispositions according to the embodiments of FIG. 2A, and will not be described again herein.

Figure 3:
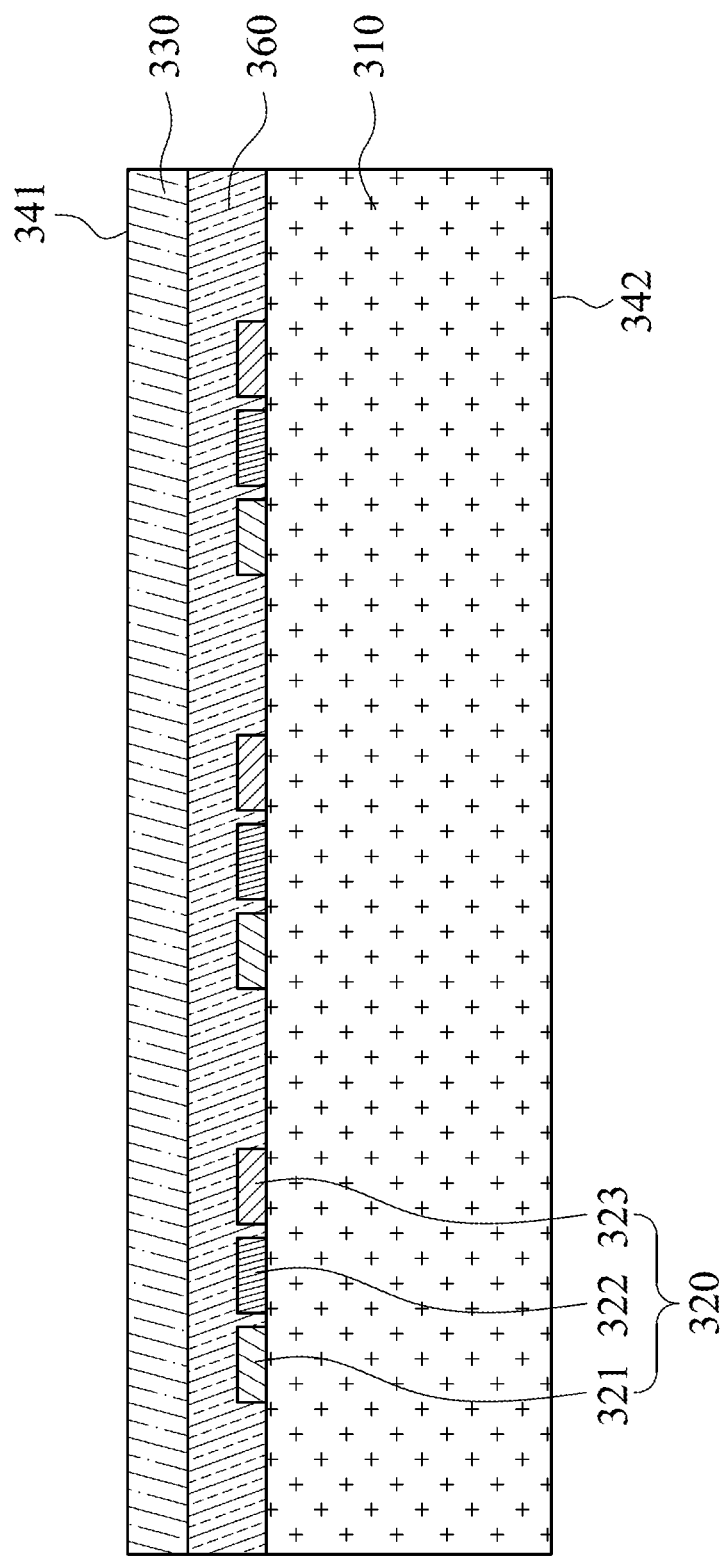
FIG. 3 is a schematic view of a micro LED transparent display according to another embodiment of the present disclosure.

FIG. 3 is a schematic view of a micro LED transparent display 300 according to another embodiment of the present disclosure. In FIG. 3, the micro LED transparent display 300 has a first display surface 341 and a second display surface 342, which are opposite to each other. The micro LED transparent display 300 includes a substrate 310, a plurality of pixels (its reference numeral is omitted), a liquid crystal layer 360 and a grating layer 330, wherein the first display surface 341 and the second display surface 342 are located on two opposite sides of the substrate 310, respectively.

Each of the pixels is arranged in arrays on the substrate 310, at least one micro unit 320 is disposed on each of the pixels as a self-luminous light source, and each of the pixels includes a plurality of micro LEDs. In detail, each of the micro units 320 includes the micro LEDs, and the micro LEDs are electrically bonded to and connected to the substrate 310. According to the embodiment of FIG. 3, a number of the micro LEDs of each of the pixels is three, and each of the micro units 320 includes the three micro LEDs 321, 322, 323. The micro LEDs 321, 322, 323 are separated into a red micro LED, a green micro LED and a blue micro LED, respectively, that is, the micro LEDs 321, 322, 323 emit a red light, a green light and a blue light, respectively, and the sequence thereof is not limited to the embodiment of FIG. 3.

According to the embodiment of FIG. 3, the grating layer 330 is disposed on the micro units 320, and the grating layer 330 is a reflective polarizer film. The reflective polarizer film is configured to cooperate with the liquid crystal layer 360, and a specific polarized light can be reflected via the reflective polarizer film. In detail, the substrate 310 has a liquid crystal control-electrode layer (not shown) and a micro LED control-electrode layer (not shown), wherein a liquid crystal of the liquid crystal layer 360 can be controlled by the liquid crystal control-electrode layer, and the luminance of the micro LEDs 321, 322, 323 is bonded to and controlled by the micro LED control-electrode layer.

In particular, lights (its reference numeral is omitted) generated from the micro LEDs 321, 322, 323 of the pixels can be controlled by the grating layer 330, and the lights partially penetrate through the first display surface 341 and are partially reflected and penetrate through the second display surface 342. Therefore, the control of the light direction (that is, a display image can be shown from a front side, a back side or both of the front side and the back side) can be obtained, and the size or the thickness of the micro LED transparent display 300 can be reduced.

The liquid crystal is rotated by controlling the electric field via the liquid crystal control-electrode layer so as to decide a polarization degree of the lights of the micro units 320 and adjust the reflectance via the grating layer 330. Therefore, a dual-side display or a single-side display of the micro LED transparent display 300 can be set up on demand, and a displaying luminance of the dual-side display of the micro LED transparent display 300 can be suitably adjusted.

It should be mentioned that the liquid crystal control-electrode layer can be also disposed on two sides of the liquid crystal layer 360, that is, the liquid crystal control-electrode layer is located on the substrate 310 and the surface of the grating layer 330 facing the liquid crystal layer 360.

The liquid crystal layer 360 is located between the substrate 310 and the grating layer 330 and covers the micro units 320. A plurality of spacers (not shown) are also disposed on the substrate 310, and the spacers are configured to control and maintain a thickness of the liquid crystal layer 360. The aforementioned disposition is the common knowledge of a general LCD, and other details of the general LCD will not be described herein. In particular, the liquid crystal layer 360 is configured to change a refractivity of the lights and control a degree of the penetration of the specific polarized light and the reflection of the specific polarized light from the micro units 320. It is better that the thickness of the liquid crystal layer 360 is not larger than twice of a height of each of the micro LEDs 321, 322, 323, but larger than the height of the micro LEDs 321, 322, 323. When the thickness of the crystal liquid layer 360 is larger than twice of the height of each of the micro LEDs 321, 322, 323, the electric field must be strengthened so as to drive the liquid crystal rotating, and the light transmittance is also lowered; when the thickness of the liquid crystal layer 360 is smaller than the height of the micro LEDs 321, 322, 323, the micro LEDs 321, 322, 323 cannot be covered by the liquid crystal layer 360. Therefore, the display quality of the micro LED transparent display 300 gets better when the thickness of the liquid crystal layer 360 is larger than the height of the micro LEDs 321, 322, 323 and smaller than twice of the height of each of the micro LEDs 321, 322, 323.

Further, all of other structures and dispositions according to the embodiment of FIG. 3 are the same as the structures and the dispositions according to the embodiments of FIG. 1, and will not be described again herein.

Figure 4:
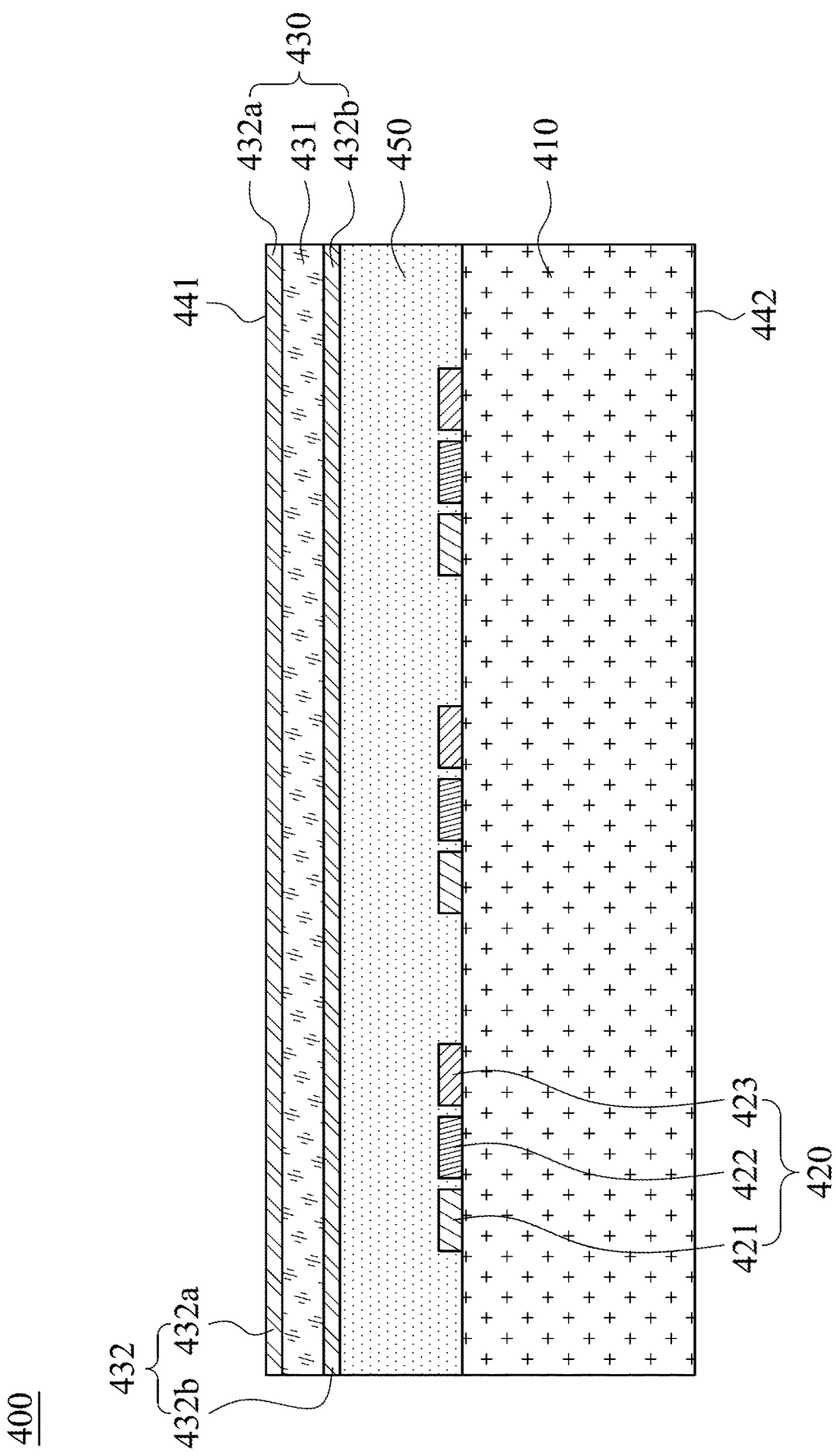
FIG. 4 is a schematic view of a micro LED transparent display according to still another embodiment of the present disclosure.

FIG. 4 is a schematic view of a micro LED transparent display 400 according to still another embodiment of the present disclosure. In FIG. 4, the micro LED transparent display 400 has a first display surface 441 and a second display surface 442, which are opposite to each other. The micro LED transparent display 400 includes a substrate 410, a plurality of pixels (its reference numeral is omitted), a flat layer 450 and at least one grating layer 430, wherein the first display surface 441 and the second display surface 442 are located on two opposite sides of the substrate 410, respectively.

Each of the pixels is arranged in arrays on the substrate 410, at least one micro unit 420 is disposed on each of the pixels as a self-luminous light source, and each of the pixels includes a plurality of micro LEDs. In detail, each of the micro units 420 includes the micro LEDs, and the micro LEDs are electrically bonded to and connected to the substrate 410. According to the embodiment of FIG. 4, a number of the micro LEDs 421, 422, 423 of each of the pixels is three, and each of the micro units 420 includes the three micro LEDs 421, 422, 423. The micro LEDs 421, 422, 423 are separated into a red micro LED, a green micro LED and a blue micro LED, respectively, that is, the micro LEDs 421, 422, 423 emit a red light, a green light and a blue light, respectively, and the sequence thereof is not limited to the embodiment of FIG. 4.

The grating layer 430 is disposed on the micro units 420, and the micro LEDs 421, 422, 423 are located between the grating layer 430 and the substrate 410. According to the embodiment of FIG. 4, the grating layer 430 includes an electrochromic layer 431 and an electrode structure 432, wherein the electrochromic layer 431 is interposed between the electrode structure 432. Further, the electrochromic layer 431 can be made of a metal oxide, such as a titania, and the electrochromic layer 431 is configured to control a light reflectance of the micro LEDs 421, 422, 423. Lights (its reference numeral is omitted) generated from the micro LEDs 421, 422, 423 of the pixels can be controlled by the grating layer 430, and the lights partially penetrate through the first display surface 441 and are partially reflected and penetrate through the second display surface 442. Therefore, the control of the light direction (that is, a display image can be shown from a front side, a back side or both of the front side and the back side) can be obtained, and the size or the thickness of the micro LED transparent display 400 can be reduced.

The electrode structure 432 includes an upper electrode pattern 432a and a lower electrode pattern 432b, and the electrochromic layer 431 is located between the upper electrode pattern 432a and the lower electrode pattern 432b. The electrochromic layer 431 is controlled by an electric field generated from the upper electrode pattern 432a and the lower electrode pattern 432b for adjusting a degree of a light penetration and a light reflection from the micro units 420. Therefore, a dual-side display or a single-side display of the micro LED transparent display 400 can be set up on demand, and a displaying luminance of the dual-side display of the micro LED transparent display 400 can be suitably adjusted. Further, the electrode structure 432 is a transparent conductive layer, and the upper electrode pattern 432a and the lower electrode pattern 432b can be an entire film, or the upper electrode pattern 432a and the lower electrode pattern 432b can be patterned according to the locations of the pixels.

The flat layer 450 is located between the substrate 410 and the grating layer 430 and covers the micro LEDs 421, 422, 423, and the flat layer 450 is an optical adhesive layer, wherein the optical adhesive layer has the light transmittance, and the optical adhesive layer can be made of a polypropylene, but the present disclosure is not limited thereto.

Further, all of other structures and dispositions according to the embodiment of FIG. 4 are the same as the structures and the dispositions according to the embodiments of FIG. 1, and will not be described again herein.

Figure 5:
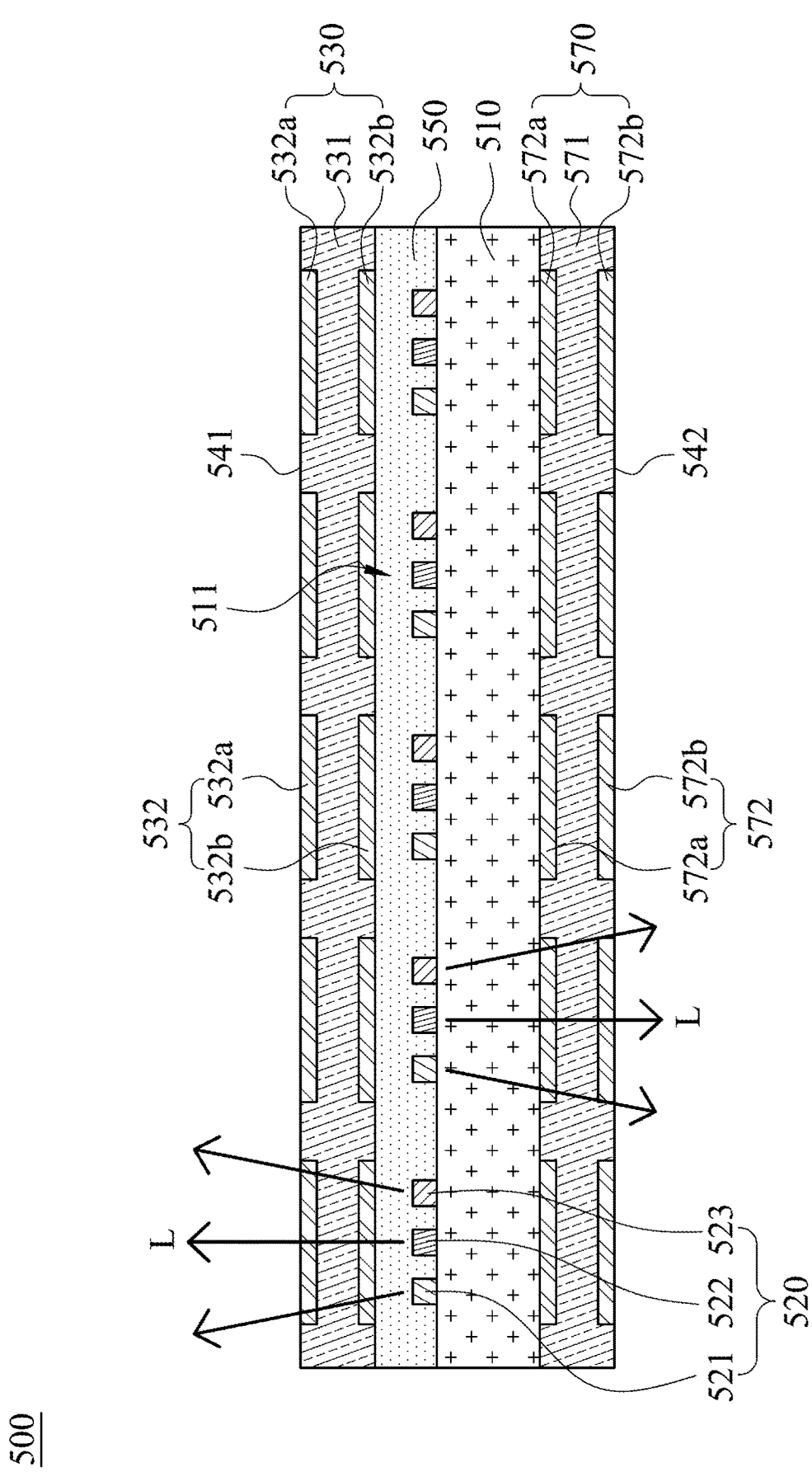
FIG. 5 is a schematic view of a micro LED transparent display according to another embodiment of the present disclosure.

FIG. 5 is a schematic view of a micro LED transparent display 500 according to another embodiment of the present disclosure. In FIG. 5, the micro LED transparent display 500 has a first display surface 541 and a second display surface 542, which are opposite to each other. The micro LED transparent display 500 includes a substrate 510, a plurality of pixels 511, a flat layer 550, a first grating layer 530 and a second grating layer 570, wherein the first display surface 541 and the second display surface 542 are located on two opposite sides of the substrate 510, respectively.

Each of the pixels 511 is arranged in arrays on the substrate 510, at least one micro unit 520 is disposed on each of the pixels 511 as a self-luminous light source, and each of the pixels 511 includes a plurality of micro LEDs. In detail, each of the micro units 520 includes the micro LEDs, and the micro LEDs are electrically bonded to and connected to the substrate 510. According to the embodiment of FIG. 5, a number of the micro LEDs of each of the pixels 511 is three, and each of the micro units 520 includes the three micro LEDs 521, 522, 523. The micro LEDs 521, 522, 523 are separated into a red micro LED, a green micro LED and a blue micro LED, respectively, that is, the micro LEDs 521, 522, 523 emit a red light, a green light and a blue light, respectively, and the sequence thereof is not limited to the embodiment of FIG. 5.

One of main differences between the micro LED transparent display 500 according to the embodiment of FIG. 5 and the micro LED transparent display 100 according to the embodiment of FIG. 1 is a number of the grating layer, wherein the number of the grating layers according to the embodiment of FIG. 5 is two, and the grating layers according to the embodiment of FIG. 5 are the first grating layer 530 and the second grating layer 570. The first grating layer 530 and the second grating layer 570 are disposed on the two opposite sides of the substrate 510, respectively, and the micro LEDs 521, 522, 523 are located between the first grating layer 530 and the second grating layer 570. Furthermore, a material of the first grating layer 530 can be the same as a material of the second grating layer 570, for example, the material of the first grating layer 530 and the second grating layer 570 can be reflective dyed liquid crystal layers or absorption dyed liquid crystal layers. According to the embodiment of FIG. 5, both of the first grating layer 530 and the second grating layer 570 are the absorption dyed liquid crystal layers, but the present disclosure is not limited thereto.

According to the embodiment of FIG. 5, the first grating layer 530 includes a dyed liquid crystal layer 531 and an electrode structure 532, and the second grating layer 570 includes a dyed liquid crystal layer 571 and an electrode structure 572, wherein the dyed liquid crystal layer 531 is interposed between the electrode structure 532, and the dyed liquid crystal layer 571 is interposed between the electrode structure 572.

In detail, the electrode structure 532 of the first grating layer 530 is configured to control a transmittance of lights L generated from the micro LEDs 521, 522, 523 of the pixels 511. The electrode structure 532 is designed according to each pixel 511, so that the electrode structure 532 can adjust the lights L penetrate through the first display surface 541 by pixels 511 respectively. Likewise, the electrode structure 572 of the second grating layer 570 is configured to control the transmittance of the lights L generated from the micro LEDs 521, 522, 523 of the pixels 511. The electrode structure 572 is designed according to each pixel 511, so that the electrode structure 572 can adjust the lights L penetrate through the second display surface 542 by pixels 511 respectively.

The lights L do not be absorbed by the dyed liquid crystals between adjacent two of the pixels 511, and the transparency of the micro LED transparent display 500 is maintained. Furthermore, the electrode structure 532 includes an upper electrode pattern 532a and a lower electrode pattern 532b, and the dyed liquid crystal layer 531 is located between the upper electrode pattern 532a and the lower electrode pattern 532b; the electrode structure 572 includes an upper electrode pattern 572a and a lower electrode pattern 572b, and the dyed liquid crystal layer 571 is located between the upper electrode pattern 572a and the lower electrode pattern 572b. The dyed liquid crystals of the dyed liquid crystal layer 531 can be controlled by an electric field generated from the upper electrode pattern 532a and the lower electrode pattern 532b for adjusting the absorption of the lights L, and the dyed liquid crystals of the dyed liquid crystal layer 571 can be controlled by an electric field generated from the upper electrode pattern 572a and the lower electrode pattern 572b for adjusting the absorption of the lights L. According to the embodiment of FIG. 5, the locations of the electrode structures 532, 572 are arranged according to locations of the pixels 511.

The flat layer 550 is located between the substrate 510 and the first grating layer 530 and covers the micro LEDs 521, 522, 523, and the flat layer 550 is an optical adhesive layer, wherein the optical adhesive layer has high light transmittance, and the optical adhesive layer can be made of a polypropylene, but the present disclosure is not limited thereto.

Further, all of other structures and dispositions according to the embodiment of FIG. 5 are the same as the structures and the dispositions according to the embodiments of FIG. 1, and will not be described again herein.

In summary, both of the transparency and the luminance of the micro LED transparent display can be maintained, and the size or the thickness of the micro LED transparent display can be reduced. Moreover, the control of the light direction (that is, a display image can be shown from a front side, a back side or both of the front side and the back side) can be obtained. Further, the micro LED transparent display of the present disclosure can be applied to the outdoor billboards and the exhibition windows, even can be applied to the windows of the cars, but the applications of the present disclosure are not limited thereto. Therefore, the dual-side display, the transparency and the effect of lowering the cost of the panel of the micro LED transparent display can be achieved.

The foregoing description, for purpose of explanation, has been described with reference to specific examples. It is to be noted that Tables show different data of the different examples; however, the data of the different examples are obtained from experiments. The examples were chosen and described in order to best explain the principles of the disclosure and its practical applications, to thereby enable others skilled in the art to best utilize the disclosure and various examples with various modifications as are suited to the particular use contemplated. The examples depicted above and the appended drawings are exemplary and are not intended to be exhaustive or to limit the scope of the present disclosure to the precise forms disclosed. Many modifications and variations are possible in view of the above teachings.

What is claimed is:

1. A micro LED transparent display, having a first display surface and a second display surface, which are opposite to each other, the micro LED transparent display comprising:
   a substrate, the first display surface and the second display surface located on two opposite sides of the substrate, respectively;
   a plurality of pixels arranged in arrays on the substrate, each of the pixels comprising a plurality of micro LEDs, and the micro LEDs electrically connected to the substrate; and
   at least one grating layer disposed on the substrate, and the micro LEDs located between the at least one grating layer and the substrate;
   wherein lights generated from the micro LEDs of the pixels can be controlled by the at least one grating layer, and the lights partially penetrate through the first display surface and are partially reflected and penetrate through the second display surface.

2. The micro LED transparent display of claim 1, wherein the at least one grating layer is a dyed liquid crystal layer, an electrophoresis layer or an electrochromic layer.

3. The micro LED transparent display of claim 2, further comprising:
a flat layer located between the substrate and the at least one grating layer, and covering the micro LEDs.

4. The micro LED transparent display of claim 3, wherein a height of the flat layer is L1, a height of each of the micro LEDs is L2, and the following condition is satisfied:
$10 \geq L1/L2 > 5$.

5. The micro LED transparent display of claim 1, wherein an area ratio of the micro LEDs of each of the pixels is 10% to 25%.

6. The micro LED transparent display of claim 1, wherein the at least one grating layer is a reflective polarizer film.

7. The micro LED transparent display of claim 6, further comprising:
a liquid crystal layer located between the substrate and the at least one grating layer, and covering the micro LEDs.

8. The micro LED transparent display of claim 1, wherein a width of each of the micro LEDs is smaller than 30 micrometers, a spacing between adjacent two of the pixels is P, and the following condition is satisfied:
$P \geq 100$ micrometers.

9. The micro LED transparent display of claim 8, wherein a thickness of each of the micro LEDs arranges from 5 micrometers to 10 micrometers.

10. The micro LED transparent display of claim 1, wherein the at least one grating layer comprises an electrode structure for adjusting the at least one grating layer to control a degree of a light penetration and a light reflection.

11. The micro LED transparent display of claim 10, wherein the electrode structure is a transparent conductive layer.

12. The micro LED transparent display of claim 1, wherein a number of the micro LEDs of each of the pixels is three, and the three micro LEDs emit a blue light, a green light and a red light, respectively.

13. The micro LED transparent display of claim 1, wherein a number of the at least one grating layer is two, each of the two grating layers is a first grating layer and a second grating layer, the first grating layer and the second grating layer are disposed on the two opposite sides of the substrate, respectively, and the micro LEDs are located between the first grating layer and the second grating layer.

14. The micro LED transparent display of claim 13, wherein a material of the first grating layer is the same as a material of the second grating layer, and both of the first grating layer and the second grating layer are reflective dyed liquid crystal layers or absorption dyed liquid crystal layers.

* * * * *